United States Patent
Köstler et al.

(10) Patent No.: US 10,551,463 B2
(45) Date of Patent: Feb. 4, 2020

(54) METHOD AND MAGNETIC RESONANCE APPARATUS FOR RECONSTRUCTING AN IMAGE FROM DATA ACQUIRED FROM A FREQUENCY-MODULATED BALANCED STEADY-STATE FREE PRECESSION SEQUENCE

(71) Applicant: Siemens Healthcare GmbH, Erlangen (DE)

(72) Inventors: Herbert Köstler, Retzbach (DE); Anne Slawig, Wuerzburg (DE)

(73) Assignee: Siemens Healthcare GmbH, Erlangen (DE)

( * ) Notice: Subject to any disclaimer, the term of this patent is extended or adjusted under 35 U.S.C. 154(b) by 106 days.

(21) Appl. No.: 15/711,511

(22) Filed: Sep. 21, 2017

(65) Prior Publication Data

US 2019/0086500 A1    Mar. 21, 2019

(51) Int. Cl.
*G01V 3/00*     (2006.01)
*G01R 33/561*   (2006.01)
(Continued)

(52) U.S. Cl.
CPC ..... *G01R 33/5614* (2013.01); *G01R 33/4824* (2013.01); *G01R 33/4828* (2013.01); *G01R 33/56545* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

2011/0089945 A1* 4/2011 Doyle ................ G01R 33/4824
                                                              324/309
2011/0091090 A1* 4/2011 Dahlqvist Leinhard .....................
                                                          G01R 33/4828
                                                                 382/131
(Continued)

OTHER PUBLICATIONS

Bangerter et al., "Analysis of multiple-acquisition SSFP," Magnetic Resonance in Medicine, vol. 51, No. 5, pp. 1038-1047 (2004).
(Continued)

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

In a method and magnetic resonance (MR) apparatus for data acquisition with fat-water separation in a resulting MR image, an MR data acquisition sequence is operated to acquire MR signals from a subject. Said MR signals comprise fat signals originating from fat in the subject and water signals originating from water in the subject, are acquired by executing a frequency-modulated balanced steady-state free-precession (bSSFP) sequence. The MR signals are entered as numerical values into a memory organized as k-space, the memory thereby containing k-space data. An image is reconstructed from the k-data and subjected to regional phase correction. The corrected image being composed of respective pixels having an intensity produced by the fat signals and an intensity produced by the water signals, with the respective pixels being readily distinguishable from each other in the image due to use of the frequency-modulated bSSFP sequence and the block regional correction.

20 Claims, 5 Drawing Sheets

(51) Int. Cl.
*G01R 33/48* (2006.01)
*G01R 33/565* (2006.01)

(58) Field of Classification Search
USPC .......................................................... 324/309
See application file for complete search history.

(56) References Cited

U.S. PATENT DOCUMENTS

| | | | | |
|---|---|---|---|---|
| 2015/0327783 | A1* | 11/2015 | Wang | A61B 5/0263 600/419 |
| 2016/0109546 | A1* | 4/2016 | Machii | G01R 33/56554 324/322 |
| 2016/0131727 | A1* | 5/2016 | Sacolick | G01R 33/445 324/318 |
| 2016/0131729 | A1* | 5/2016 | Kang | G01R 33/50 324/309 |

OTHER PUBLICATIONS

Schär et al., "Cardiac SSFP imaging at 3 Tesla," Magnetic Resonance in Medicine, vol. 51, No. 4, pp. 799-806 (2004).
Foxall, D.L., "Frequency-Modulated Steady-State Free Precession Imaging," Magnetic Resonance in Medicine, vol. 48, pp. 502-508 (2002).
Benkert, et. al.: "Dynamically Phase-Cycled Radial Balanced SSFP Imaging for Efficient Banding Removal";: Magnetic Resonance in Medicine; vol. 73; pp. 182-194; (2015).
Wansapura,: "Abdominal Fat—Water Separation with SSFP at 3 Tesla";: Pediatr Radiol; vol. 37, pp. 69-73; (2007)
Benkert, et al.: "Fast Isotropic Banding Free bSSFP Imaging Using 3D Dynamically Phase-Cycled Radial bSSFP (3D DYPR-SSFP)";: ZEMEDI; pp. 1-12; (2015).
Hargreaves, et. al.: "Dual-Acquisition Phase-Sensitive Fat—Water Separation Using Balanced Steady-State Free Precession"; Magnetic Resonance Imaging; vol. 24; pp. 113-122; (2006).
MA,: "Breath-Hold Water and Fat Imaging Using a Dual-Echo Two-Point Dixon Technique With an Efficient and Robust Phase-Correction Algorithm"; in: Magnetic Resonance Medicine; vol. 52; pp. 415-419 (2004).

* cited by examiner

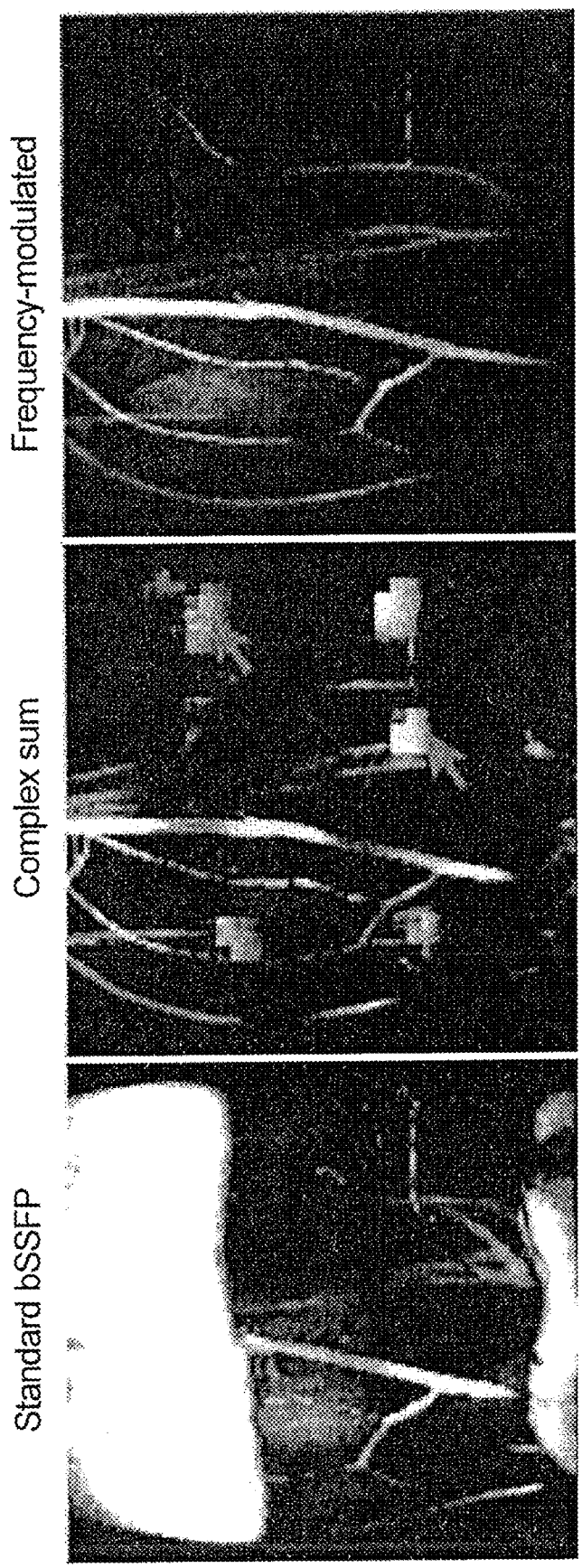

METHOD AND MAGNETIC RESONANCE APPARATUS FOR RECONSTRUCTING AN IMAGE FROM DATA ACQUIRED FROM A FREQUENCY-MODULATED BALANCED STEADY-STATE FREE PRECESSION SEQUENCE

BACKGROUND OF THE INVENTION

Field of the Invention

The present invention concerns methods and systems for magnetic resonance (MR) imaging, and in particular to such methods and systems that make use of a frequency-modulated balanced steady-state free precession (FM bSSFP) sequence in order to acquire raw data from a subject, with the raw data then being used to reconstruct an image of the region of the subject from which the raw data were acquired.

Description of the Prior Art

In order to acquire all data that are necessary so as to reconstruct a magnetic resonance image, it is necessary for all data entry locations in k-space to be filled, i.e., a data entry must be made at each available point in k-space. Typically, this requires several excitations of nuclear spins in the region of interest in the subject, and readout of the resulting MR signals along different trajectories in k-space. Typical examples of such trajectories are parallel readout lines in k-space in Cartesian imaging, and radial lines in k-space in projection reconstruction imaging.

Balanced steady-state free precession (bSSFP) sequences are known and often used in MR imaging due to their short scan times, high SNR and excellent contrast. A drawback of such sequences is that they are prone to banding artifacts in the reconstructed image, which can considerably reduce the image quality. Such problems are described in Schär et al. "SSFP Imaging at 3 T Tesla," Magnetic Resonance in Medicine, Vol. 51, pp. 799-806 (2004) and Bangerter et al., "Analysis of Multiple-Acquisition SSFP," Magnetic Resonance in Medicine, Vol. 51, pp. 1038-1047 (2004).

The article Foxall et al., "Frequency-Modulated Steady-State Free Precession Imaging," Magnetic Resonance in Medicine, Vol. 48, pp. 502-508 (2002) demonstrates that the steady state of bSSFP does, in fact, tolerates slow frequency changes, thereby enabling a sweep to be made through different frequencies in one acquisition. The dynamic range of frequency from one acquired line of k-space to another, within one radial measurement, has proven suitable to create banding-free images, even in the presence of high-field inhomogeneities. This has been presented in Benkert et al., "Dynamically Phase-Cycled Radial Balanced SSFP Imaging for Efficient Banding Removal," Magnetic Resonance in Medicine, Vol. 73, pp. 182-194 (2015) and Benkert et al., "Fast Isotropic Banding-Free bSSFP Imaging Using 3D Dynamically Phase-Cycled Radial bSSFP (3D DYPR SSFP), Z. für Med. Phys., Vol. 26, pp. 63-74 (2016).

In the final image, it can be of interest to determine whether the signal of a certain pixel originated in tissue containing primarily fat or containing primarily water. Particularly in bSSFP, fat tissue produces a very bright signal in comparison to water, which can obscure underlying pathologies. This has been noted in Wansapura, "Abdominal Fat-Water Separation with SSFP at 3 T Tesla," Pediatric Radiology, Vol. 37, pp. 68-73 (2006).

SUMMARY OF THE INVENTION

An object of the present invention is to provide a method and MR apparatus wherein the raw MR data are obtained so that the reconstructed pixels can be robustly separated into water and fat pixels, without banding artifacts and without tissue swaps, even in the presence of high field inhomogeneity.

The above object is achieved in accordance with the present invention by operating an MR data acquisition scanner with a bSSFP acquisition sequence for water-fat separation, wherein frequency-modulation is used to acquire the raw data that are then reconstructed into an MR image within which water and fat can be separated. Regional phase correction is applied to all measured images. Water and fat are then separated in the resulting image, based on the sign of the real part of the signal of each pixel.

The method according to the invention uses a regional phase correction and the phase-sensitive approach, which have conventionally been applied only to standard bSSFP, or combinations of multiple acquisitions thereof. The present invention proceeds using a single frequency-modulated acquisition of the MR raw data.

BRIEF DESCRIPTION OF THE DRAWINGS

FIG. 5 shows sagittal maximum intensity projections of the water-only images for standard bSSFP, the complex sum of two phase-cycled standard bSSFP measurements, and a frequency-modulated bSSFP measurement.

DESCRIPTION OF THE PREFERRED EMBODIMENTS

Figure 1:
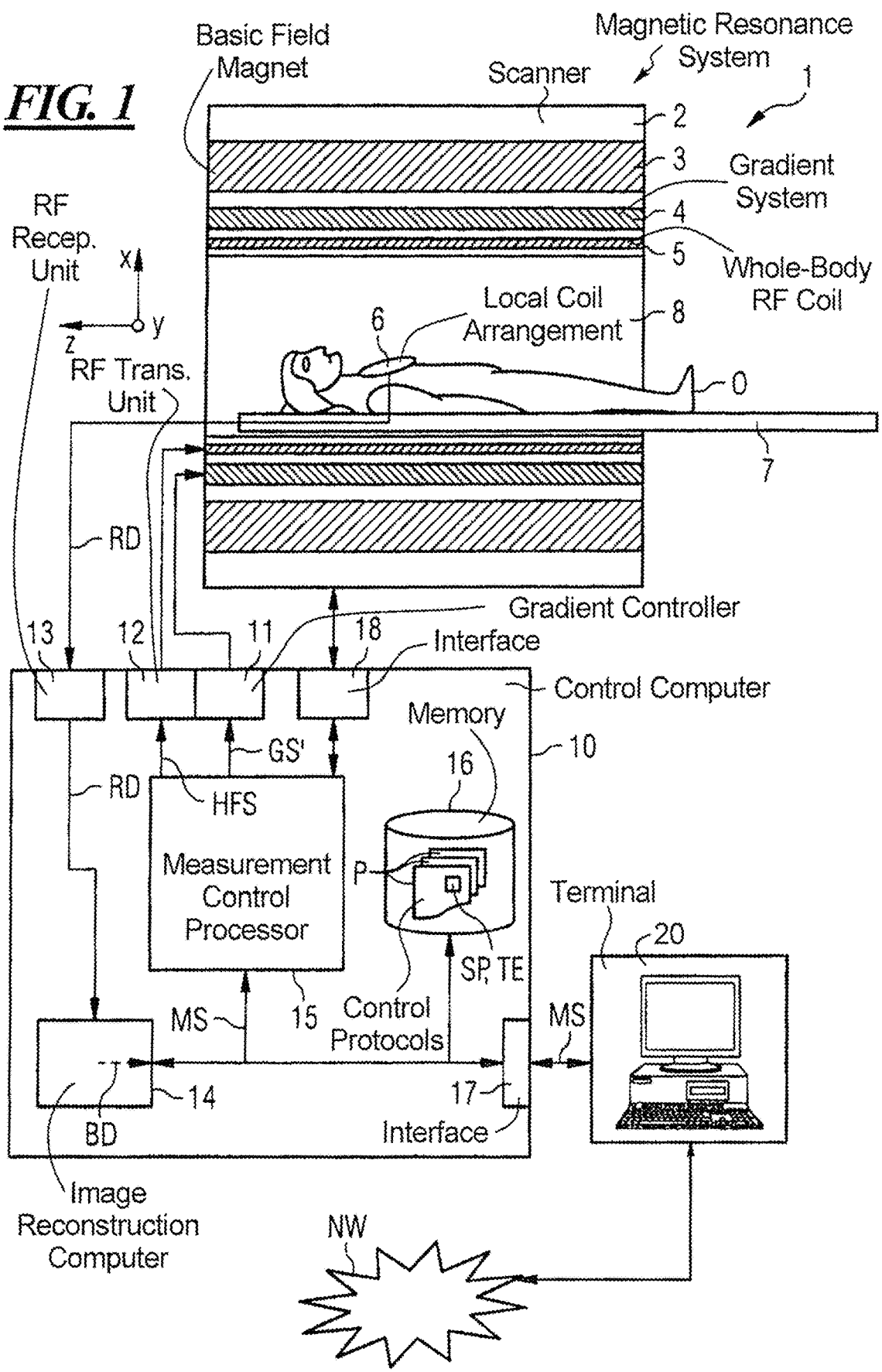
FIG. 1 schematically illustrates a magnetic resonance imaging apparatus constructed and operating in accordance with the present invention.

A magnetic resonance system 1 according to the invention is schematically shown in FIG. 1. It includes the actual magnetic resonance scanner 2 with an examination space or patient tunnel located therein. A bed 7 can be driven into this patient tunnel 8, such that a patient O or examination subject lying on the bed 7 can be supported at a defined position within the magnetic resonance scanner 2 relative to the magnet system and radio-frequency system arranged therein during an examination, or can be moved between different positions during a measurement.

Basic components of the magnetic resonance scanner 2 are a basic field magnet 3, a gradient system 4 with magnetic field gradient coils to generate magnetic field gradients in the x-, y- and z-directions, and a whole-body radio-frequency (RF) antenna 5. The magnetic field gradient coils can be controlled independently of one another in the x-, y- and z-directions so that gradients can be applied in arbitrary logical spatial directions (for example in the slice-selection direction, in the phase coding direction or in the readout direction) via a predetermined combination, wherein these directions normally depend on the selected slice orientation. The transmission (radiation) of RF signals in order to induce of magnetic resonance signals in the examination subject O can take place via the whole-body antenna 5. The MR signals are received with a local coil 6, which can be composed of one or more individual reception coils. The local coil 6 can also be used to radiate the RF signals. All of these components are known in principle to those skilled in the art and therefore are only schematically shown in FIG. 1.

The components of the magnetic resonance scanner 2 are controlled by a control computer, which can be formed by a number of individual computers (which may be spatially separated and connected among one another via suitable cables or the like). This control computer 10 is connected via a terminal interface 17 with a terminal 20 via which an operator can control the entire system 1. In the present case, this terminal 20 (as a computer) is equipped with keyboard, one or more monitors and additional input devices (for example mouse or the like) so that a graphical user interface is provided to the operator.

Among other things, the control computer 10 has a gradient controller 11 that can in turn have multiple subcomponents. Via this gradient controller 11, the individual gradient coils are provided with control signals according to a gradient pulse sequence GS. These gradient pulses are radiated (activated) at precisely provided time positions and with a precisely predetermined time curve during a measurement.

The control computer 10 also has a radio-frequency transmission unit 12 in order to feed electrical signals respectively representing radio-frequency pulses into the whole-body radio-frequency coil 5 (or the local coil 6) according to a predetermined radio-frequency pulse sequence RFS of the pulse sequence MS. The radio-frequency pulse sequence RFS includes excitation and/or refocusing pulses. The reception of the magnetic resonance signals then occurs with the use of the reception coils of the local coil 6, and the raw data RF received in this manner are read out and processed by an RF reception unit 13. The magnetic resonance signals are passed in digital form as raw data RF to a reconstruction computer 14, which reconstructs the image data BD from the raw data using the reconstruction algorithm described above, and stores the image data BD in a memory 16 and/or passes the image data BD via the interface 17 to the terminal 20 so that the operator can view the image. The image data BD can also be stored at other locations via a network NW and/or be displayed and evaluated.

Control commands are transmitted via an interface 18 to other components of the magnetic resonance scanner 2 (such as the bed 7 or the basic field magnet 3, for example), and measurement values or other information are received.

The gradient controller 11, the RF transmission unit 12 and the RF reception unit 13 are controlled, in a coordinated manner, by a measurement control processor 15. Via corresponding commands, this ensures that the desired gradient pulse sequences GS and radio-frequency pulse sequences RFS are emitted. Moreover, for this purpose it must be ensured that the magnetic resonance signals are read out by the reception coils of the local coil array 6 by the RF reception unit 13 at the appropriate point in time and are processed further. The measurement control processor 15 likewise controls the interface 18.

The basic operation of such a magnetic resonance measurement (apart from the reconstruction described above) and the cited components to control it are known to those skilled in the art, so that they need not be described in further detail herein. Moreover, such a magnetic resonance scanner 2 and the associated control device can have an additional components that are likewise not explained in detail herein. It should also be noted that the magnetic resonance scanner 2 can also be designed differently—for example with a laterally open patient space, or as a smaller scanner in which only one body part is positioned.

In order to start a measurement, via the terminal an operator can typically select a control protocol P provided for this measurement from a memory 16 in which a number of control protocols P for different measurements are stored. Among other things, this control protocol P includes various control parameters for the respective measurement. Among these control parameters are specific basic rules for the desired pulse sequence, for example whether it is a spin echo sequence, a gradient echo sequence, etc. These control parameters also designated the magnetizations of nuclear spins to be achieved via the individual radio-frequency pulses, rules about the k-space trajectory to be used to enter the raw data into k-space, as well as parameters that set slice thicknesses, slice intervals, number of slices, echo time in a spin echo sequence, etc.

With the use of the terminal 20, the operator can modify a portion of these control parameters in order to create an individual control protocol for a currently desired measurement. For this purpose, variable control parameters are offered for modification at a graphical user interface of the terminal, for example.

Moreover, via a network NW the operator can retrieve control protocols (for example from a manufacturer of the magnetic resonance system 1) and may possibly modify such protocols, in order to operate the system.

In general, the family of MR data acquisition sequences known as balanced sequences make use of a balanced gradient wave form. This means that the balanced gradient wave form will act on any stationary spin between two consecutive RF pulses so as to return that spin to the same state that it had before the gradients were applied. A balanced gradient wave form has a net value of zero.

Figure 2:
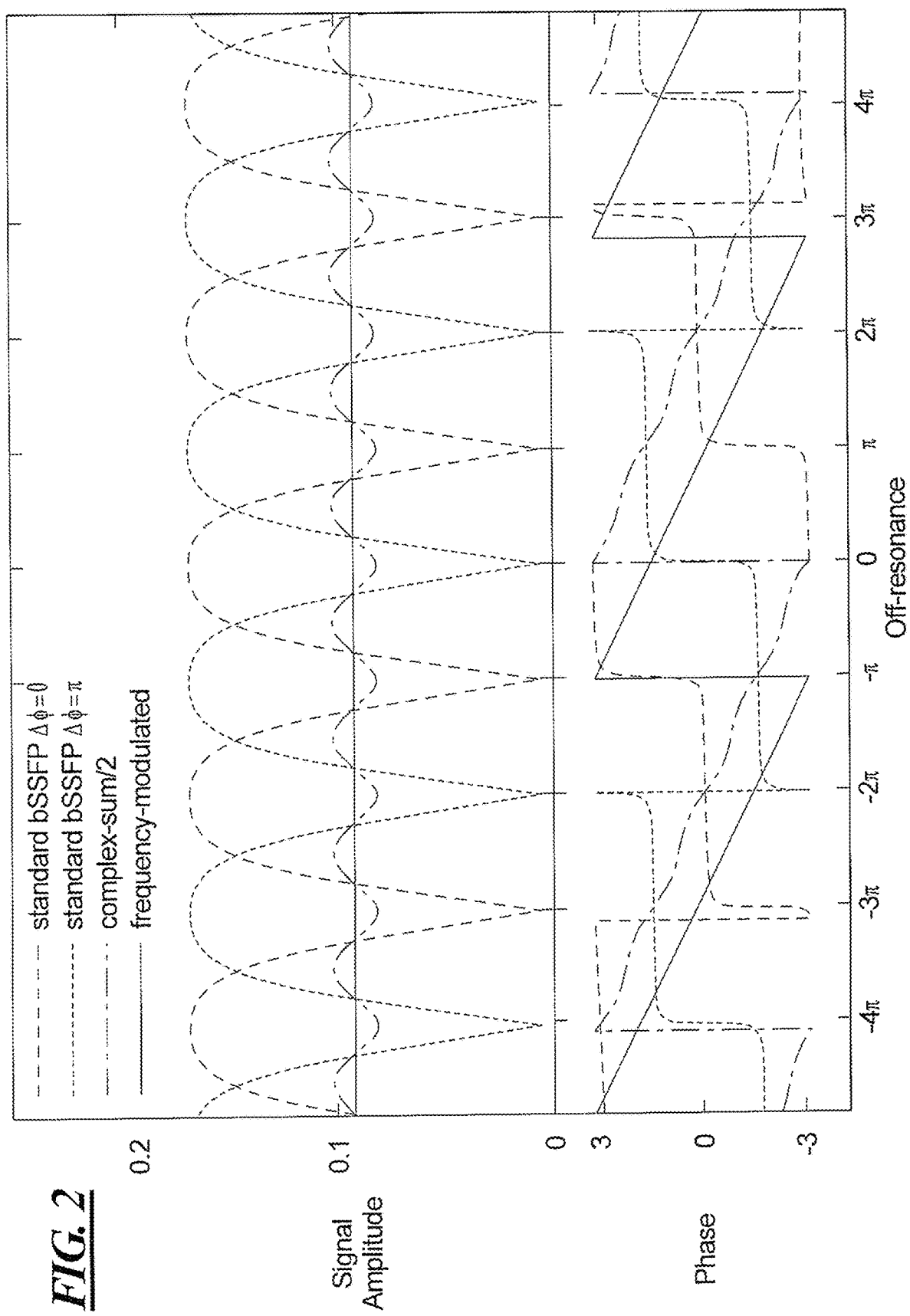
FIG. 2 shows the amplitude and phase response of the signal of standard and frequency-modulated bSSFP sequences as a function of off-resonance.

FIG. 2 shows the amplitude and phase response of the signal of a standard bSSFP sequence and a frequency-modulated bSSFP sequence as a function of off-resonance for a specific set of parameters (e.g. flip angle: 50°, TE: 2 ms, TR: 4 ms, T1: 2000 ms, T2: 800 ms). Standard bSSFP is characterized by magnitude plateaus and areas of constant phase, separated by periodic signal drops to zero and the accompanying phase jumps. A complex sum combination of the two phase-cycled (shifted) measurements, also shown in FIG. 2, results in a smoother magnitude and a continuously increase linear phase. The frequency-modulated measurement shows a similar behavior, featuring an even smoother amplitude and phase behavior.

For one measurement, the precise position within the off-resonance profile is not known before the measurement, and varies dependent on the exact chemical shift of the measured tissue (e.g., water or main peak of fat), as well as depending on local field strength. The chemical shift between water and fat stems from the different molecular environment of the protons in those different tissues, and also depends on the magnetic field strength. For typical field strengths of clinical MR scanners, the chemical shift difference between water and the main peak of fat is 220 Hz at 1.5 T, and 440 Hz at 3 T.

In bSSFP, the off-resonance can be expressed in radian, and the off-resonance difference $f_{diff}$ between two tissues or positions and signal phase $\theta$ are associated by the repetition time TR of the measurement according to the relationship $\theta = 2 \cdot \pi \cdot TR \cdot f_{diff}$.

Although the exact off-resonance of one pixel in one measurement is unknown before the imaging experiment and depends on the chemical shift of the measured tissue and the local field strength, the distance between water and main peak of fat in the off-resonance profile can be set selectively by manipulating the TR of the measurement. By choosing $TR=(2n+1)/2 \cdot f_{diff}$, where n is an integer and $f_{diff}$ is the chemical shift difference between water and the main peak of fat in Hz, the resonance frequencies of the two tissues will always be placed at an odd number of passbands apart from each other, and therefore will produce a signal with opposite phase (0 or π). This difference in phase can be exploited to separate water and fat, as explained in Hargreaves et al., "Dual-Acquisition Phase-Sensitive Fat-Water Separation Using Balanced Steady-State Free Precession," Magnetic Resonance in Imaging, Vol. 24, pp. 113-122 (2006). A local linear trend in phase with off-resonance can be eliminated by a region-growing algorithm, such as the block regional phase correction. Examples of the block regional phase correction are given in the aforementioned article by Hargreaves et al., as well as in Ma, "Breath-Hold Water and Fat Imaging Using a Dual-Echo Two-Point Dixon Technique with an Efficient and Robust Phase-Correction Algorithm," Magnetic Resonance in Medicine, Vol. 52, pp. 415-419 (2004).

Figure 3:
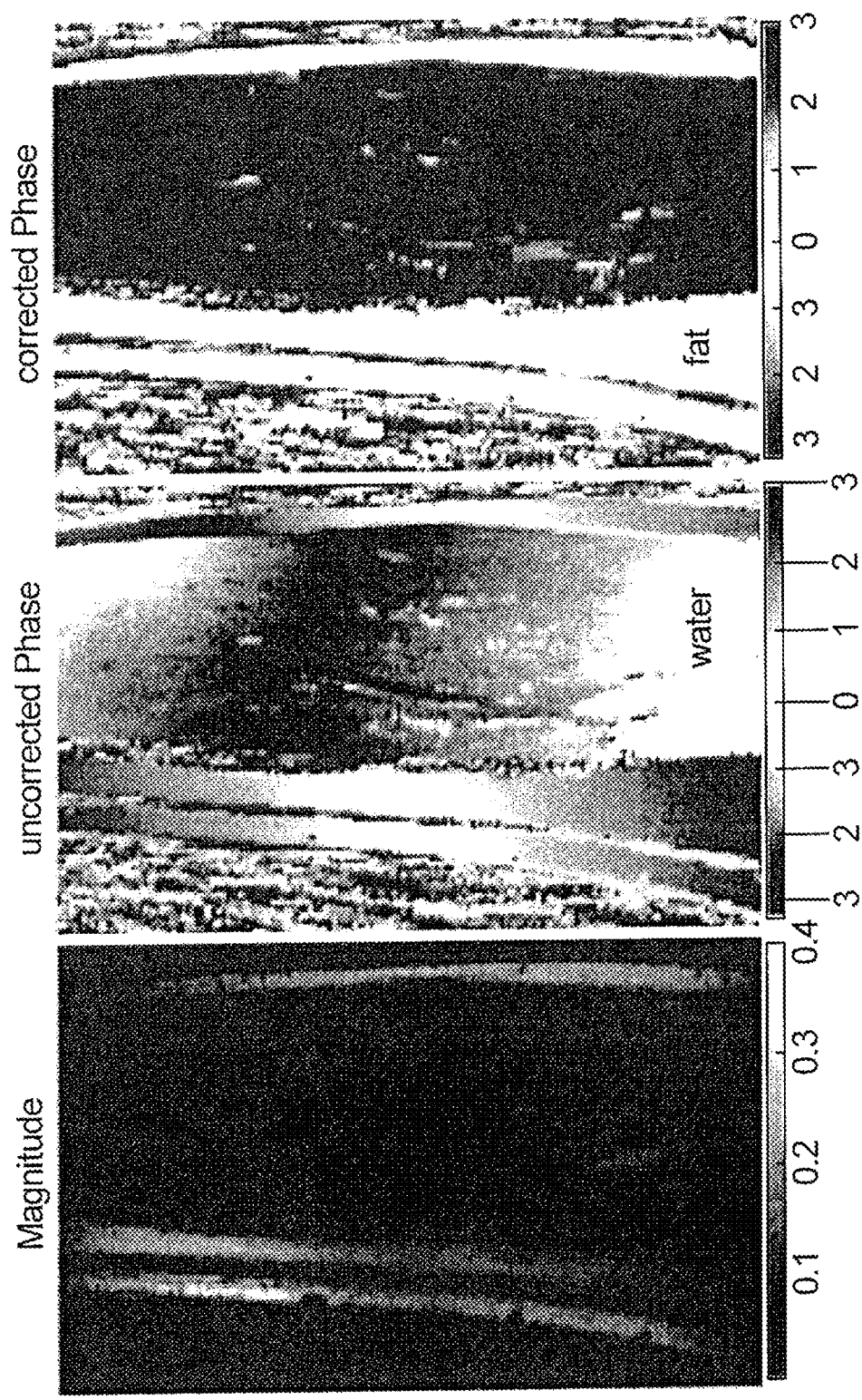
FIG. 3 shows images from which the effect of the block regional phase correction on image phase can be seen.

An example of the resulting phase correction is shown in FIG. 3. After correcting the linear trend in phase, caused by off-resonance, water and fat can be distinguished by their respective phases.

As noted, in accordance with the invention a frequency-modulated bSSFP acquisition is used for water-fat separation. Because the signal behavior shows the same features as the complex sum combination, the same reconstruction pipeline can be applied to such a measurement. The combination of multiple different frequencies during the acquisition reduces ripples in magnitude and phase that remain after the combination of only two acquisitions. Therefore, a smooth magnitude image is produced, without banding artifacts, allowing a very robust water-fat separation.

Figure 4:
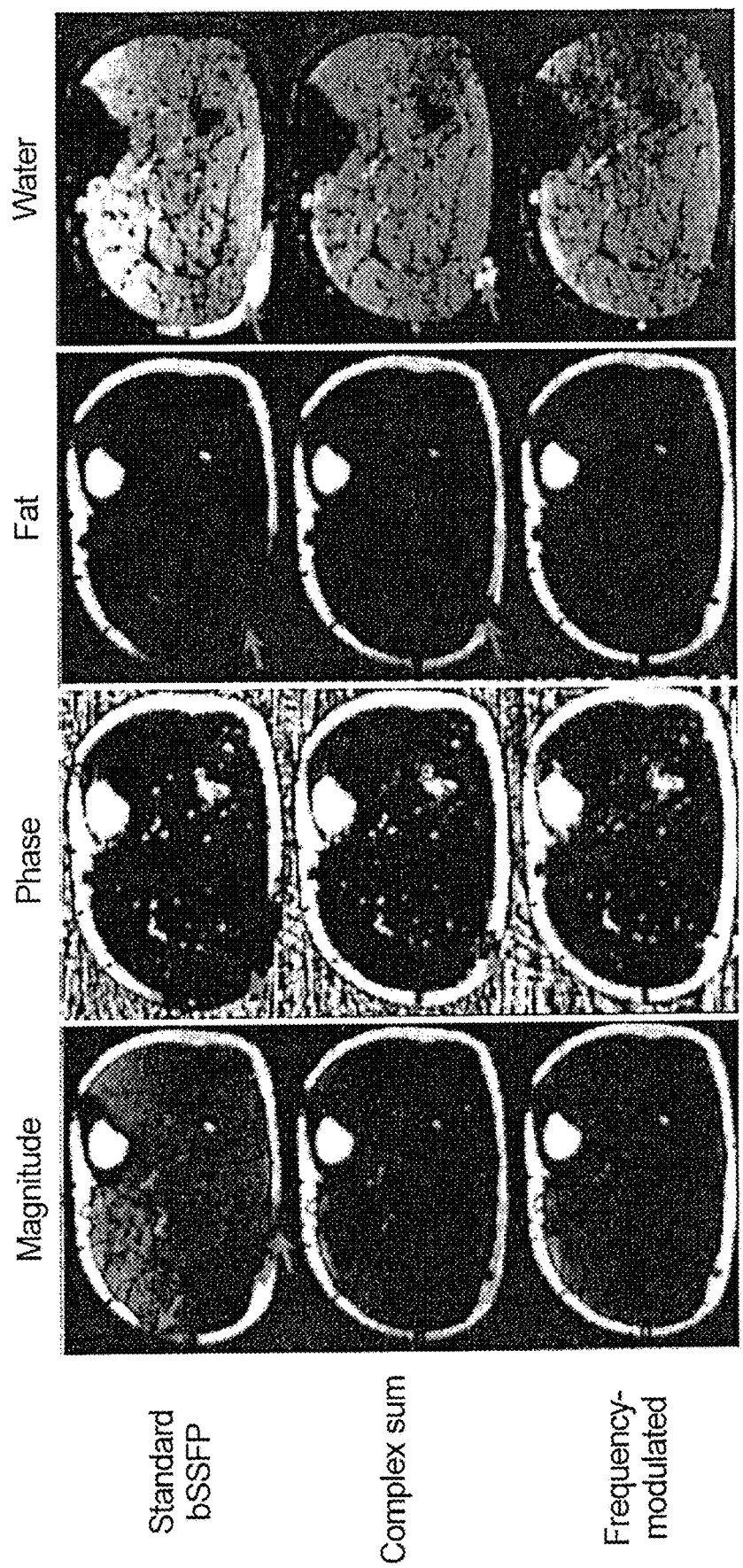
FIG. 4 shows magnitude, phase, fat-only and water-only images of a cross-section of the lower leg for a standard bSSFP measurement, the complex sum of two phase-cycled standard bSSFP measurements, and a frequency-modulated bSSFP measurement.

In order to experimentally verify the procedure in accordance with the invention, radial bSSFP measurements, with and without frequency modulation, were performed on a 1.5 T MR system (Siemens MAGNETOM Aera) using a 30-channel body array coil. The former featured a shift in the offset frequency for each projection, covering a total range of 220 Hz. Other imaging parameters were TE=2.3 ms, TR=4.6 ms, flip angle 30°, resolution 1.1×1.1×1.1 mm³, with a total acquisition time of 4 min, 6 s. (More generally, TE can be 2.3±0.4 ms, and TR can be 4.6±0.8 ms.) The measurement subject was the lower leg of a healthy volunteer. All images were reconstructed by gridding and 2D Fourier transform. Block regional phase correction was applied to all measurements, with and without frequency modulation, as well as to the complex sum of the two phase-cycled standard bSSFP acquisitions. Water and fat were then separated based on the sign of the real part of the signal in each pixel. The arrows in FIG. 4 designate banding artifacts due to field inhomogeneity, the associated changes in signal phase, and subsequent swaps of tissue in the water and fat image.

FIG. 5 shows sagittal maximum intensity projections (MIPs) of the water-only images for standard bSSFP, the complex sum of two phase-cycled standard bSSFP measurements, and a frequency-modulated bSSFP measurement. Incorrectly assigned pixels are the cause of a bright fat signal, which overlays the intended depiction of the vasculature.

The method and apparatus and storage medium according to the invention use a frequency-modulated bSSFP acquisition for robust water-fat separation, with block-regional phase correction, and a phase-sensitive approach, that have conventionally been applied only to standard bSSFP, or combinations of multiple acquisitions. The method according to the invention requires only one signal acquisition in order to achieve the aforementioned water-fat separation.

The examples described above demonstrate the ability to robustly separate water and fat, even in the presence of a high field inhomogeneity. Significant advantages of this approach are the reduction of measurement time, compared to multiple acquisition procedures, and the robustness with respect to off-resonance, compared to standard bSSFP and even complex sum procedures.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for magnetic resonance (MR) data acquisition with fat-water separation in a resulting MR image, said method comprising:
    with a control computer, operating an MR data acquisition scanner to acquire MR signals from a subject, said MR signals comprising signals respectively originating from two different tissues in the subject respectively having two distinct resonance frequencies, by executing a frequency-modulated balanced steady-state free-precession (bSSFP) sequence that gives said MR signals a varying phase component;
    from said control computer, entering said MR signals as numerical values into a memory organized as k-space, said memory thereby containing k-space data that also represent said varying phase component;
    in said control computer, reconstructing an image from said k-space data and performing a regional phase correction that eliminates the varying phase component in said image, and thereby obtaining a corrected image comprising respective pixels having an intensity produced by a first of said two signals originating from a first of the two different tissues and an intensity produced by a second of said two signals originating from a second of the two different tissues, said respective pixels being readily distinguishable from each other with respect to each of the two different tissues in said image due to use of said frequency-modulated bSSFP sequence and said block regional correction; and
    making said corrected image available from said control computer in electronic form as a data file.

2. A method as claimed in claim 1 comprising operating said MR data acquisition scanner to execute said bSSFP sequence with a repetition time that causes respective resonance frequencies of the respective main peaks of said two tissues to consistently be at an odd number of passbands apart from each other, so that said two signals have opposite phases.

3. A method as claimed in claim 2 comprising operating said MR data acquisition scanner with said repetition time (TR) being $TR=(2n+1)/2 \cdot f_{diff}$,
    wherein n is an integer and $f_{diff}$ is chemical shift difference between the respective main peaks of said two tissues in Hertz.

4. A method as claimed in claim 1 comprising operating said MR data acquisition scanner to execute said bSSFP sequence with an echo time of 2.3±0.4 ms and a repetition time of 4.6±0.8 ms.

5. A method as claimed in claim 1 comprising operating said MR data acquisition scanner to execute said bSSFP sequence such that the k-space is fully sampled only once.

6. A method as claimed in claim 1 comprising operating said MR data acquisition scanner to execute said bSSFP sequence with a non-Cartesian acquisition scheme for collecting the k-space data.

7. A method as claimed in claim 1 comprising operating said MR data acquisition scanner to execute said bSSFP sequence with a radial, a spiral, a stack of stars, or a stack of spirals trajectory for collecting the k-space data.

8. A method as claimed in claim 7, wherein each consecutively collected line associated with the bSSFP sequence is spaced one golden angle apart.

9. A method as claimed in claim 1 wherein said two different tissues are fat and water, and comprising operating said MR data acquisition scanner to acquire said two signals as a water signal and a fat signal, respectively.

10. A magnetic resonance (MR) apparatus comprising:
an MR data acquisition scanner;
a control computer configured to operate said MR data acquisition scanner to acquire MR signals from a subject, said MR signals comprising signals respectively originating from two different tissues in the subject respectively having two distinct resonance frequencies, by executing a frequency-modulated balanced steady-state free-precession (bSSFP) sequence that gives said MR signals a varying phase component;
said control computer being configured to enter said MR signals as numerical values into a memory organized as k-space, said memory thereby containing k-space data that also represent said varying phase component;
said control computer being configured to reconstruct an image from said k-space data and to perform a regional phase correction that eliminates the varying phase component in said image, and thereby obtaining a corrected image comprising respective pixels having an intensity produced by a first of said two signals originating from a first of the two different tissues and an intensity produced by a second of said two signals originating from a second of the two different tissues, said respective pixels being readily distinguishable from each other with respect to each of the two different tissues in said image due to use of said frequency-modulated bSSFP sequence and said block regional correction; and
said control computer being configured to make said corrected image available from said control computer in electronic form as a data file.

11. An MR apparatus as claimed in claim 10 wherein said control computer is configured to operate said MR data acquisition scanner to execute said bSSFP sequence with a repetition time that causes respective resonance frequencies of the respective main peaks of said two tissues to consistently be at an odd number of passbands apart from each other, so that said two signals have opposite phases.

12. An MR apparatus as claimed in claim 11 wherein said control computer is configured to operate said MR data acquisition scanner with said repetition time (TR) being $TR=(2n+1)/2 \cdot f_{diff}$,
wherein n is an integer and $f_{diff}$ is the chemical shift between water and the main peak of fat in Hertz.

13. An MR apparatus as claimed in claim 10 wherein said control computer is configured to operate said MR data acquisition scanner to execute said bSSFP sequence with an echo time of 2.3±0.4 ms and a repetition time of 4.6±0.8 ms.

14. An MR apparatus as claimed in claim 10 wherein said control computer is configured to operate said MR data acquisition scanner to execute said bSSFP sequence such that the k-space is fully sampled only once.

15. An MR apparatus as claimed in claim 10 wherein said control computer is configured to operate said MR data acquisition scanner to execute said bSSFP sequence with a non-Cartesian acquisition scheme for collecting the k-space data.

16. An MR apparatus as claimed in claim 10 wherein said control computer is configured to operate said MR data acquisition scanner to execute said bSSFP sequence with a radial, a spiral, a stack of stars, or a stack of spirals trajectory for collecting the k-space data.

17. An MR apparatus as claimed in claim 16, wherein each consecutively collected line associated with the bSSFP sequence is spaced one golden angle apart.

18. An MR apparatus as claimed in claim 10 wherein said two different tissues are fat and water, and wherein said control computer is configured to operate said MR data acquisition scanner to acquire said two signals as a water signal and a fat signal, respectively.

19. A non-transitory, computer-readable data storage medium encoded with programming instructions, said storage medium being loaded into a computer system of an MR apparatus that comprises an MR data acquisition scanner, and said programming instructions causing said computer system to:
operate said MR data acquisition scanner to acquire MR signals from a subject, said MR signals comprising signals respectively originating from two different tissues in the subject respectively having two distinct resonance frequencies, by executing a frequency-modulated balanced steady-state free-precession (bSSFP) sequence that gives said MR signals a varying phase component;
enter said MR signals as numerical values into a memory organized as k-space, said memory thereby containing k-space data that also represent said varying phase component;
reconstruct an image from said k-space data and perform a regional phase correction that eliminates the varying phase component in said image, and thereby obtain a corrected image comprising respective pixels having an intensity produced by a first of said two signals originating from a first of the two different tissues and an intensity produced by a second of said two signals originating from a second of the two different tissues, said respective pixels being readily distinguishable from each other with respect to each of the two different tissues in said image due to use of said frequency-modulated bSSFP sequence and said block regional correction; and
store said corrected image in electronic form as a data file.

20. A storage medium as claimed in claim 19 wherein said two different tissues are fat and water, and
wherein said two signals are a water signal and a fat signal, respectively.

* * * * *